(12) United States Patent
Liu

(10) Patent No.: US 11,374,553 B2
(45) Date of Patent: Jun. 28, 2022

(54) SIGNAL PROCESSING DEVICE AND SIGNAL PROCESSING METHOD

(71) Applicant: Realtek Semiconductor Corp., HsinChu (TW)

(72) Inventor: Chih-Hao Liu, HsinChu (TW)

(73) Assignee: Realtek Semiconductor Corp., HsinChu (TW)

(*) Notice: Subject to any disclaimer, the term of this patent is extended or adjusted under 35 U.S.C. 154(b) by 200 days.

(21) Appl. No.: 16/905,941

(22) Filed: Jun. 19, 2020

(65) Prior Publication Data
US 2021/0152157 A1 May 20, 2021

(30) Foreign Application Priority Data
Nov. 19, 2019 (TW) .................................. 108141937

(51) Int. Cl.
*H03H 17/08* (2006.01)
*G06F 17/16* (2006.01)

(52) U.S. Cl.
CPC .............. *H03H 17/08* (2013.01); *G06F 17/16* (2013.01)

(58) Field of Classification Search
CPC ................................ H03H 17/18; G06F 17/16
USPC .......................................................... 708/300
See application file for complete search history.

(56) References Cited

U.S. PATENT DOCUMENTS 7,953,781 B1    5/2011   Abbaszadeh
2021/0383280 A1* 12/2021  Shaloudegi ............. G06F 17/16

FOREIGN PATENT DOCUMENTS

CN          1273460 A     11/2000

* cited by examiner

*Primary Examiner* — Tan V Mai
(74) *Attorney, Agent, or Firm* — Winston Hsu

(57) ABSTRACT

A signal processing method performed by a processor of a signal processing device and includes: generating a fundamental matrix according to at least one set of fundamental coefficients; generating a phase-shifted matrix according to a predetermined phase shift and the fundamental matrix; and generating an output sequence according to an input sequence and the phase-shifted matrix. The set of fundamental coefficients is used to generate at least one bit of a code sequence, the output sequence is a phase-shifted version of the input sequence being shifted by k cycle(s), and k is the predetermined phase shift.

20 Claims, 9 Drawing Sheets

SIGNAL PROCESSING DEVICE AND SIGNAL PROCESSING METHOD

BACKGROUND OF THE INVENTION

1. Field of the Invention

The invention relates to a signal processing device, more particularly to a signal processing device capable of performing rapid sequence permutation.

2. Description of the Prior Art

During the data transmission in a communication system, the time and frequency between the transmitter and the receiver should be synchronized first before performing the data transmission. Pseudorandom Noise (PN) or Pseudo Noise (PN) code sequence is usually utilized when performing time and frequency synchronization. The transmitter and the receiver use the same initial value (which is also called the "seed") and the same mechanism to generate the PN code sequence. The transmitter embeds the PN code sequence inside the signal to be transmitted to the peer side. The peer side, that is, the receiver which receives the signal, then calculates the correlation between the received signal and the PN code sequence maintained at the receiver side and the correlations between the received signal and one or more phase-shifted versions of the PN code sequence, so as to estimate the amount of time shift and the amount of frequency shift caused by the channel effect. After compensating for the time shift and the frequency shift, the receiver is able to decode the data successfully.

Since the PN code sequence is a cyclic sequence (by inputting the bits of the seed one after one into a Linear Feedback Shift Register (LFSR) circuit and shifting the values in the shift registers, the bits of the PN code sequence are sequentially generated/output), the output bit is usually generated based on values kept in the shift registers in one or more previous stages. Therefore, in the conventional design, the phase-shifted versions of the PN code sequence should be derived by sequentially shifting the values in the shift registers to the next stage. For example, when deriving the PN code sequence corresponding to the time index (n+k) based on the PN code sequence corresponding to the time index (n) (that is, when performing phase shift on the PN code sequence for shifting k clock cycle(s)), the PN code sequence corresponding to the time index (n) has to be shifted forward for k clock cycle(s), where in each clock cycle, the LFSR circuit outputs one bit of the PN code sequence.

However, when k is a large number, the receiver has to wait for a great number of clock cycles to obtain the required PN code sequence (that is, the phase-shifted version of the PN code sequence), which is really quite a waste of time and cause inefficiency problem.

SUMMARY OF THE INVENTION

It is an objective of the invention to provide a signal processing method for implementing rapid sequence permutation and an associated signal processing device, in order to solve the above-mentioned inefficiency problem. Via the proposed signal processing method and signal processing device, the PN code sequence can be rapidly permuted according to the required phase shift, and there is no need to wait for a lot of clock cycle(s) to obtain the required PN code sequence as the conventional design. In this manner, the conventional inefficiency problem can be solved.

At least one embodiment of the invention provides a signal processing method performed by the processor of a signal processing device comprising: generating a fundamental matrix according to at least one set of fundamental coefficients, wherein the set of fundamental coefficients is used to generate at least one bit of a code sequence; generating a phase-shifted matrix according to a predetermined phase shift and the fundamental matrix; and generating an output sequence according to an input sequence and the phase-shifted matrix. The output sequence is a phase-shifted version of the input sequence being shifted by k cycle(s), and k is the predetermined phase shift.

Another embodiment of the invention provides a signal processing method performed by the processor of a signal processing device comprising: storing a plurality of phase-shifted matrixes in a memory device of the signal processing device, wherein the phase-shifted matrixes are generated according to different phase shifts and a fundamental matrix and the fundamental matrix is used to generate a code sequence; selecting a phase-shifted matrix from the phase-shifted matrixes according to a predetermined phase shift; and generating an output sequence according to an input sequence and the selected phase-shifted matrix. The output sequence is a phase-shifted version of the input sequence being shifted by k cycle(s), and k is the predetermined phase shift.

Another embodiment of the invention provides a signal processing device comprising a memory device configured to store at least one phase-shifted matrix and a processor. The processor is coupled to the memory device and configured to read the phase-shifted matrix from the memory device and generate an output sequence according to an input sequence and the phase-shifted matrix. The phase-shifted matrix is generated according to a predetermined phase shift based on a fundamental matrix, the fundamental matrix is utilized to generate a code sequence and the output sequence is a phase-shifted version of the input sequence being shifted by k cycle(s), and k is the predetermined phase shift.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
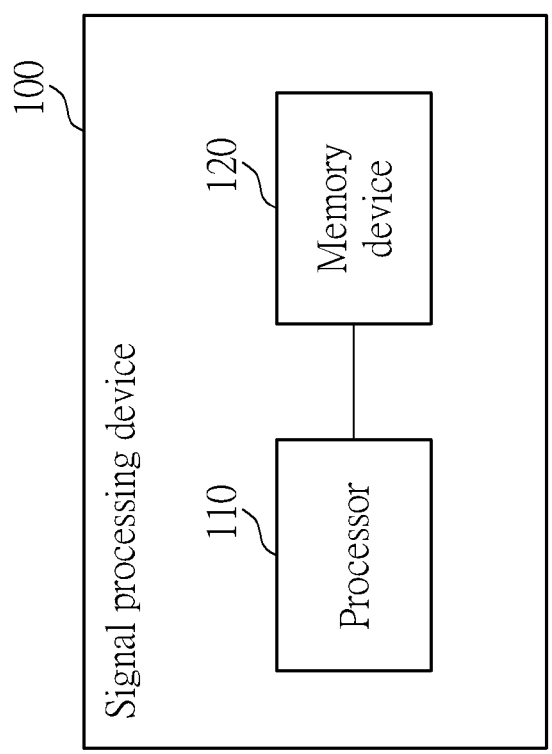
FIG. 1 shows an exemplary block diagram of a signal processing device according to an embodiment of the invention.

FIG. 1 shows an exemplary block diagram of a signal processing device according to an embodiment of the invention. The signal processing device 100 may comprise at least a processor 110 and a memory device 120. According to an embodiment of the invention, the processor 110 may directly generate an output sequence according to an input sequence and a predetermine phase shift k, wherein the output sequence is a phase-shifted version of the input sequence being shifted by k cycle(s) (that is, the output sequence is equal to a result of phase shifting the input sequence by k cycle(s)), and k is a positive integer.

Generally, a cyclic sequence, such as a PN code sequence, is generated by a Linear Feedback Shift Register (LFSR) circuit. Based on the designed feedback mechanism and the connections between the stages of shift registers comprised in the LFSR circuit, a corresponding period N will be given to the cyclic sequence output by the LFSR circuit. That is, after shifting an input sequence by N clock cycles, repeated bit patterns will be presented in the output sequence.

Different from the conventional design in which the output sequence must be generated by inputting the input sequence into the LFSR circuit and then shifting the values stored in the shift registers for multiple clock cycles, in the embodiments of the invention, the output sequence can be directly generated or derived from the input sequence by performing matrix operations. To be more specific, in the embodiments of the invention, the processor 110 may use a mechanism (for example, at least one polynomial) to derive a sequence generating matrix (e.g. a fundamental matrix), and the polynomial may be derived from the structure and design of the LFSR circuit for generating the code sequence (that is, the feedback mechanism and the connections between the stages of shift registers comprised in the LFSR circuit). Next, the processor 110 may directly derive the required output sequence by multiplying the input sequence with a power of the fundamental matrix. Suppose that the required output sequence is a result of phase shifting the input sequence by k cycle(s), the processor 110 may directly derive the required output sequence by multiplying the input sequence and the k-th power of the fundamental matrix together.

Figure 2:
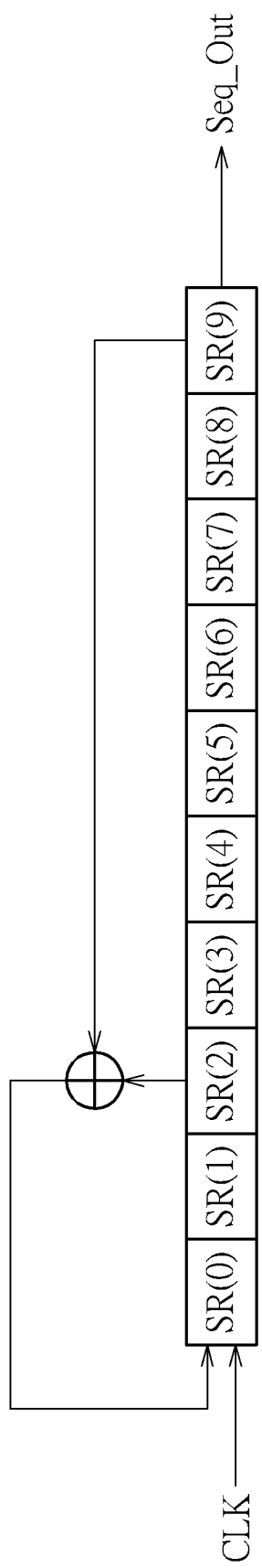
FIG. 2 shows an exemplary circuit diagram of an LFSR circuit according to an embodiment of the invention.

FIG. 2 shows an exemplary circuit diagram of an LFSR circuit according to an embodiment of the invention. The LFSR circuit 200 may comprise 10 bits (10 stages of) shift registers SR(0)~SR(9). An initial value may be given to each shift register SR(0)~SR(9), and the series of initial values given to the shift register SR(0)~SR(9) is called the "seed". Next, the LFSR circuit 200 may sequentially generate a plurality of output bits as the output sequence Seq_Out in response to the clock ticks of the clock signal CLK. Suppose that the current time index is n, the following equations may be derived based on the design of the LFSR circuit 200:

$$x0(n+1)=x2(n)+x9(n) \quad \text{Eq. (1)}$$

$$x1(n+1)=x0(n) \quad \text{Eq. (2)}$$

$$x2(n+1)=x1(n) \quad \text{Eq. (3)}$$

$$x3(n+1)=x2(n) \quad \text{Eq. (4)}$$

$$x4(n+1)=x3(n) \quad \text{Eq. (5)}$$

$$x5(n+1)=x4(n) \quad \text{Eq. (6)}$$

$$x6(n+1)=x5(n) \quad \text{Eq. (7)}$$

$$x7(n+1)=x6(n) \quad \text{Eq. (8)}$$

$$x8(n+1)=x7(n) \quad \text{Eq. (9)}$$

$$x9(n+1)=x8(n) \quad \text{Eq. (10)}$$

where $x0(n)$~$x9(n)$ are respectively the values stored in the corresponding shift registers SR(0)~SR(9) at time n, $x0(n+1)$~$x9(n+1)$ are respectively the values stored in the corresponding shift registers SR(0)~SR(9) at time (n+1).

The equations Eq. (1)~Eq. (10) show the relationships of the values stored in the corresponding shift registers when the data bits are shifted in a forward direction. Here, the "forward direction" means that the direction along which the data bits are shifted in the LFSR circuit, and which can also be regarded as the direction along which the data bits flow as the time index increases (that is, the data bits are shifted to the next stages of shift registers as the time index increases).

Figure 3:
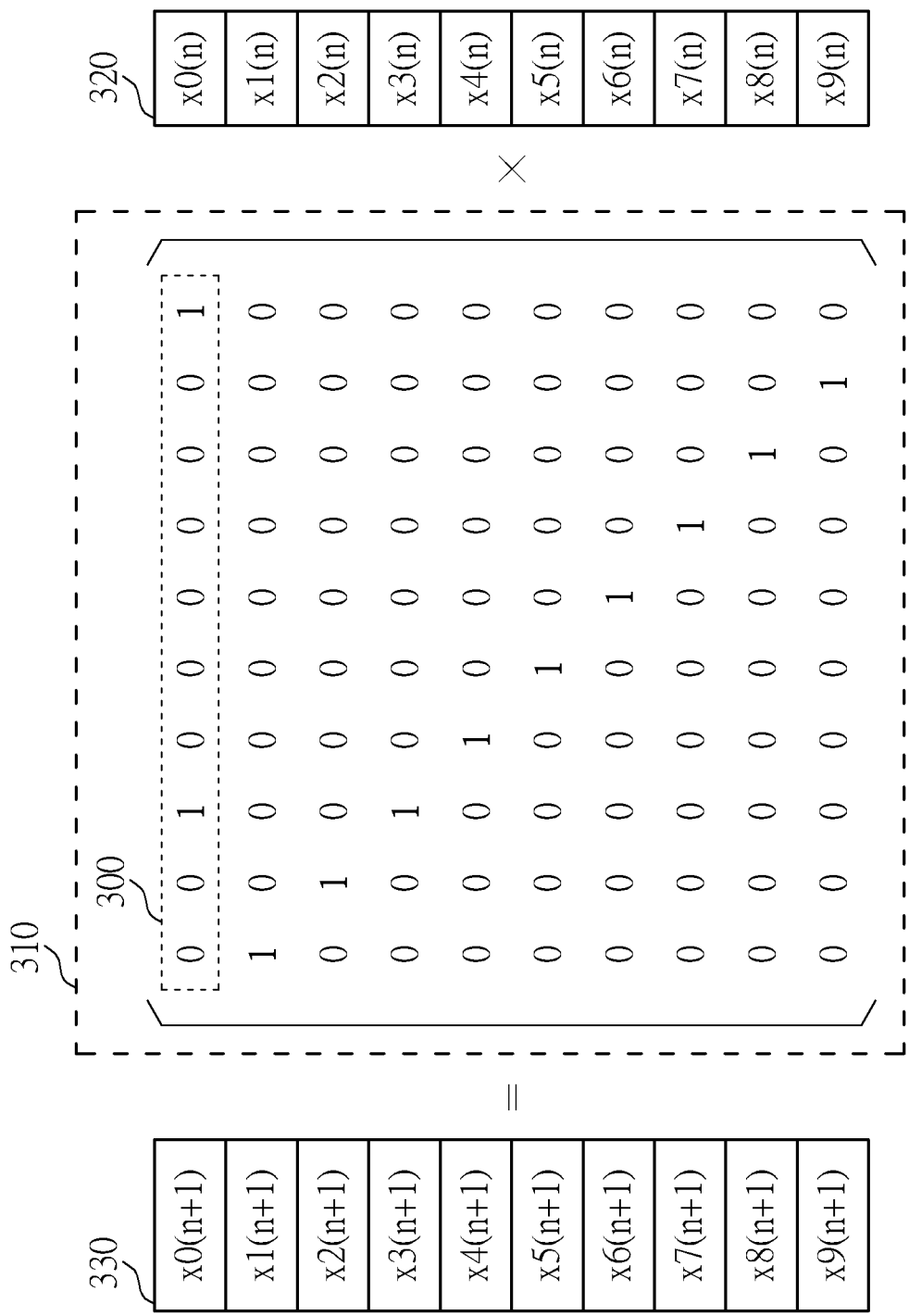
FIG. 3 is a schematic diagram showing an exemplary fundamental matrix according to an embodiment of the invention.

FIG. 3 is a schematic diagram showing an exemplary fundamental matrix according to an embodiment of the invention. The fundamental matrix 310 is generated based on the polynomial, such as the equations Eq. (1)~Eq. (10), derived from the structure and design of the LFSR circuit 200. Therefore, in this embodiment, the fundamental matrix 310 is a forward sequence generating matrix. To be more specific, the processor 110 may extract the coefficients in the equations Eq. (1)~Eq. (10) as a plurality of row vectors, and then generate the fundamental matrix 310 based on these row vectors. As shown in FIG. 3, the set of fundamental coefficients 300 is a row vector forming the fundamental matrix 310. The set of fundamental coefficients 300 is derived from the equation Eq. (1) and is used to generate at least one bit of the code sequence. According to an embodiment of the invention, the set of fundamental coefficients 300 is the first row vector (the top row vector) of the fundamental matrix 310, and the other sets of coefficients derived from the equations Eq. (2)~Eq. (10) sequentially form the second row vector to the last row vector (the bottom row vector) of the fundamental matrix 310.

FIG. 3 also shows the way to generate the output sequence according to the input sequence and the fundamental matrix. According to an embodiment of the invention, the processor 110 may directly multiply the input sequence 320 and the fundamental matrix 310 together to obtain the output sequence 330.

According to an embodiment of the invention, suppose that the required output sequence is a result of phase shifting the input sequence by k cycle(s), the processor 100 may obtain the required output sequence by directly multiplying the input sequence and the k-th power of the fundamental matrix.

Figure 4:
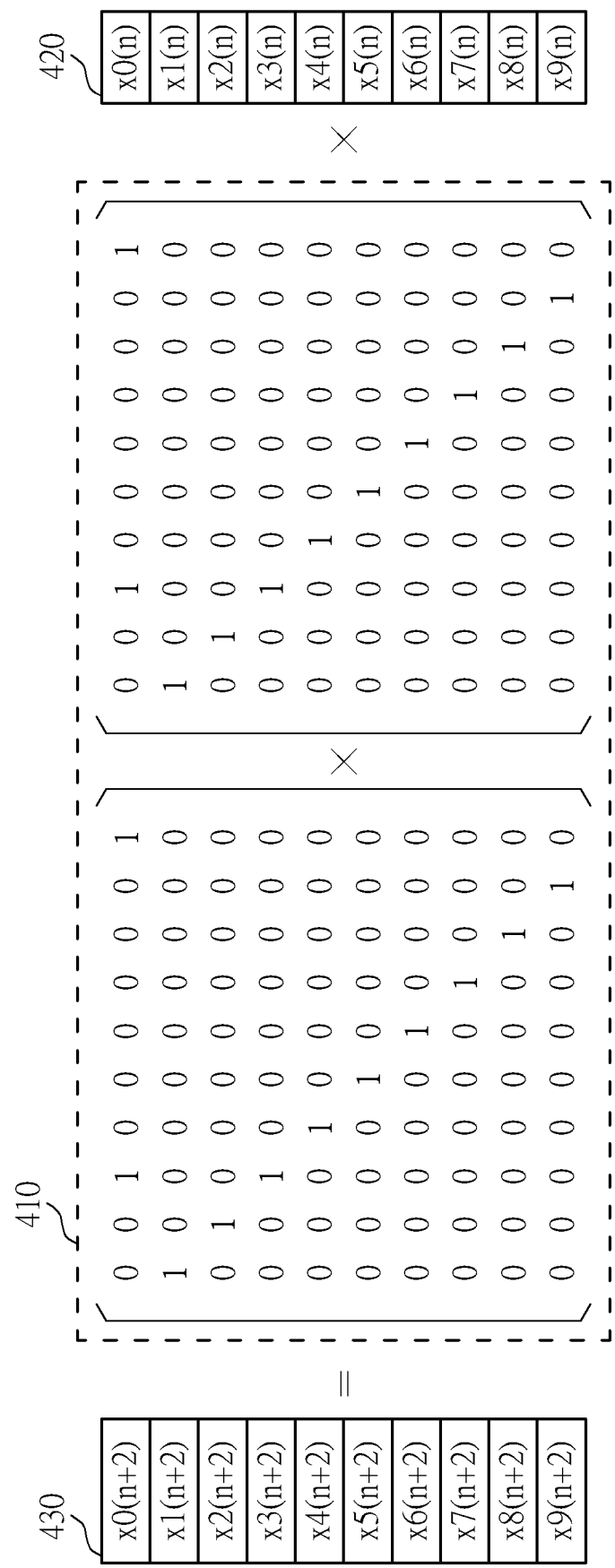
FIG. 4 is a schematic diagram showing an exemplary phase-shifted matrix according to an embodiment of the invention.

FIG. 4 is a schematic diagram showing an exemplary phase-shifted matrix according to an embodiment of the invention. In this embodiment, the phase-shifted version $x0(n+2)$~$x9(n+2)$ of the sequence $x0(n)$~$x9(n)$ by shifting 2 clock cycles in the forward direction is required. Therefore, in this embodiment, the processor 110 may directly multiply the input sequence 420 and the phase-shifted matrix 410 together to obtain the output sequence 430, where the phase-shifted matrix 410 is the $2^{nd}$ power of the fundamental matrix 310 (that is, the square of the fundamental matrix 310).

In other words, in the embodiments of the invention, when a phase-shifted version of a PN code sequence being shifted by k clock cycle(s) is required, the PN code sequence permutation can be rapidly achieved based on the required amount of phase shift k by merely deriving the k-th power of the fundamental matrix as the aforementioned phase-shifted matrix. Therefore, there is no need to wait for the LFSR circuit to operate for k clock cycle(s) to obtain the required PN code sequence as the conventional design.

The fundamental matrix 310 as shown in FIG. 3 and the phase-shifted matrix 410 shown in FIG. 4 are both the exemplary forward sequence generating matrixes. In the embodiments of the invention, the relationships of the values stored in the corresponding shift registers when the data bits are shifted in an inverse direction (that is, the backward direction) may also be derived based on the same LFSR circuit. Take the circuit diagram shown in FIG. 2 as an example, suppose that the current time index is n, the following equations may be derived based on the design of the LFSR circuit 200:

$$x0(n-1)=x1(n) \qquad \text{Eq. (11)}$$

$$x1(n-1)=x2(n) \qquad \text{Eq. (12)}$$

$$x2(n-1)=x3(n) \qquad \text{Eq. (13)}$$

$$x3(n-1)=x4(n) \qquad \text{Eq. (14)}$$

$$x4(n-1)=x5(n) \qquad \text{Eq. (15)}$$

$$x5(n-1)=x6(n) \qquad \text{Eq. (16)}$$

$$x6(n-1)=x7(n) \qquad \text{Eq. (17)}$$

$$x7(n-1)=x8(n) \qquad \text{Eq. (18)}$$

$$x8(n-1)=x9(n) \qquad \text{Eq. (19)}$$

$$x9(n-1)=x0(n)+x3(n) \qquad \text{Eq. (20)}$$

where $x0(n-1)\sim x9(n-1)$ are respectively the values stored in the corresponding shift registers SR(0)~SR(9) at time (n−1).

The equations Eq. (11)~Eq. (20) show the relationships of the values stored in the corresponding shift registers when the data bits are shifted in a backward direction. Here, the "backward direction" means that the direction inverse to the direction along which the data bits are shifted in the LFSR circuit.

Figure 5:
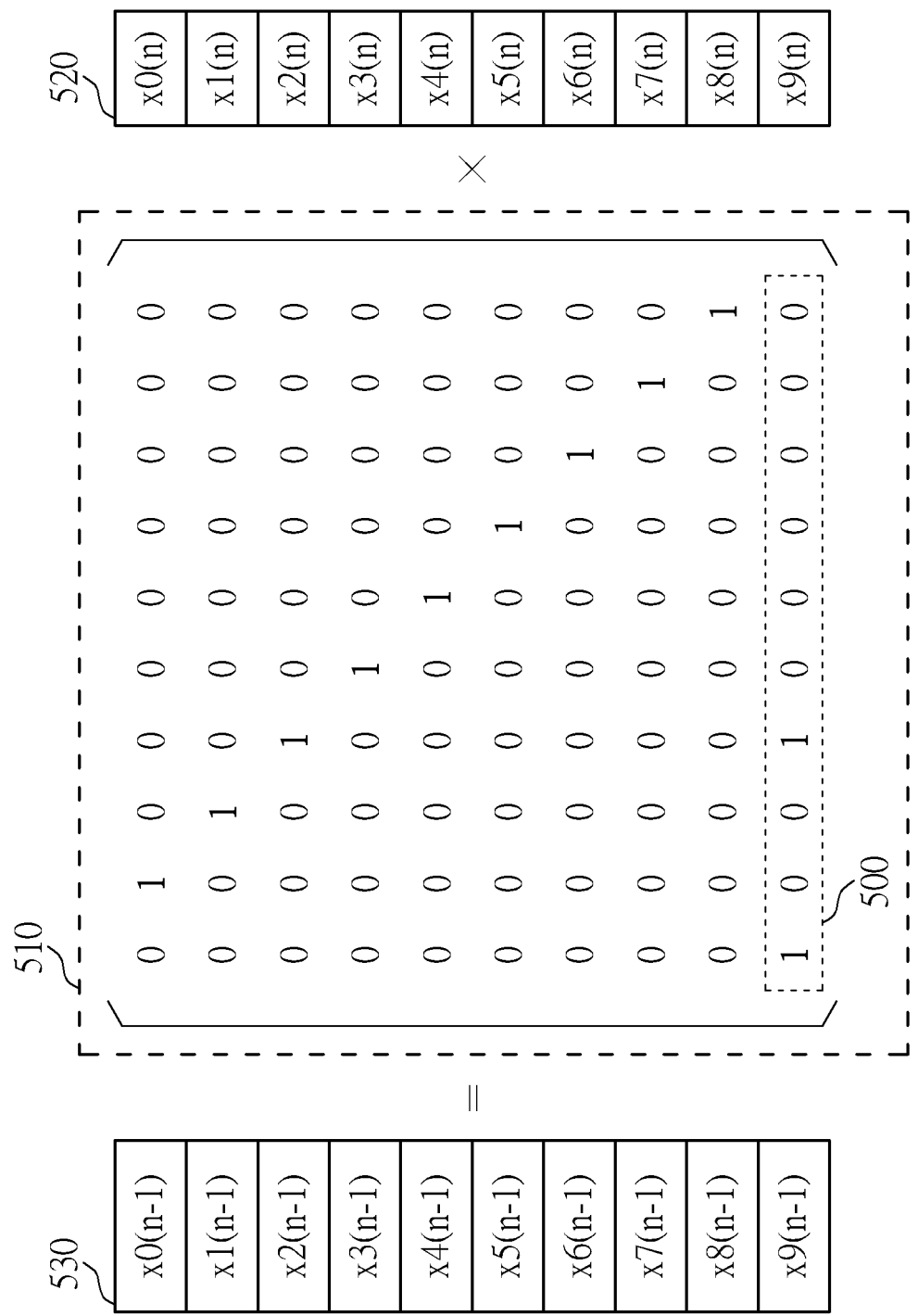
FIG. 5 is a schematic diagram showing an exemplary fundamental matrix according to another embodiment of the invention.

FIG. 5 is a schematic diagram showing an exemplary fundamental matrix according to another embodiment of the invention. The fundamental matrix 510 is generated based on the polynomial, such as the equations Eq. (11)~Eq. (20), derived from the structure and design of the LFSR circuit 200. Therefore, in this embodiment, the fundamental matrix 510 is a backward sequence generating matrix. To be more specific, the processor 110 may extract the coefficients of the equations Eq. (11)~Eq. (20) as a plurality of row vectors, and then generate the fundamental matrix 510 based on these row vectors. As shown in FIG. 5, the set of fundamental coefficients 500 is a row vector forming the fundamental matrix 510. The set of fundamental coefficients 500 is derived from the equation Eq. (20) and is used to generate at least one bit of the code sequence. According to an embodiment of the invention, the set of fundamental coefficients 500 is the last row vector (the bottom row vector) of the fundamental matrix 510, and the sets of coefficients derived from the equations Eq. (11)~Eq. (20) sequentially form the first row vector (the top row vector) to the last row vector (the bottom row vector) of the fundamental matrix 510.

FIG. 5 also shows the way to generate the output sequence according to the input sequence and the fundamental matrix. According to an embodiment of the invention, the processor 110 may directly multiply the input sequence 520 and the fundamental matrix 510 together to obtain the output sequence 530.

Figure 6:
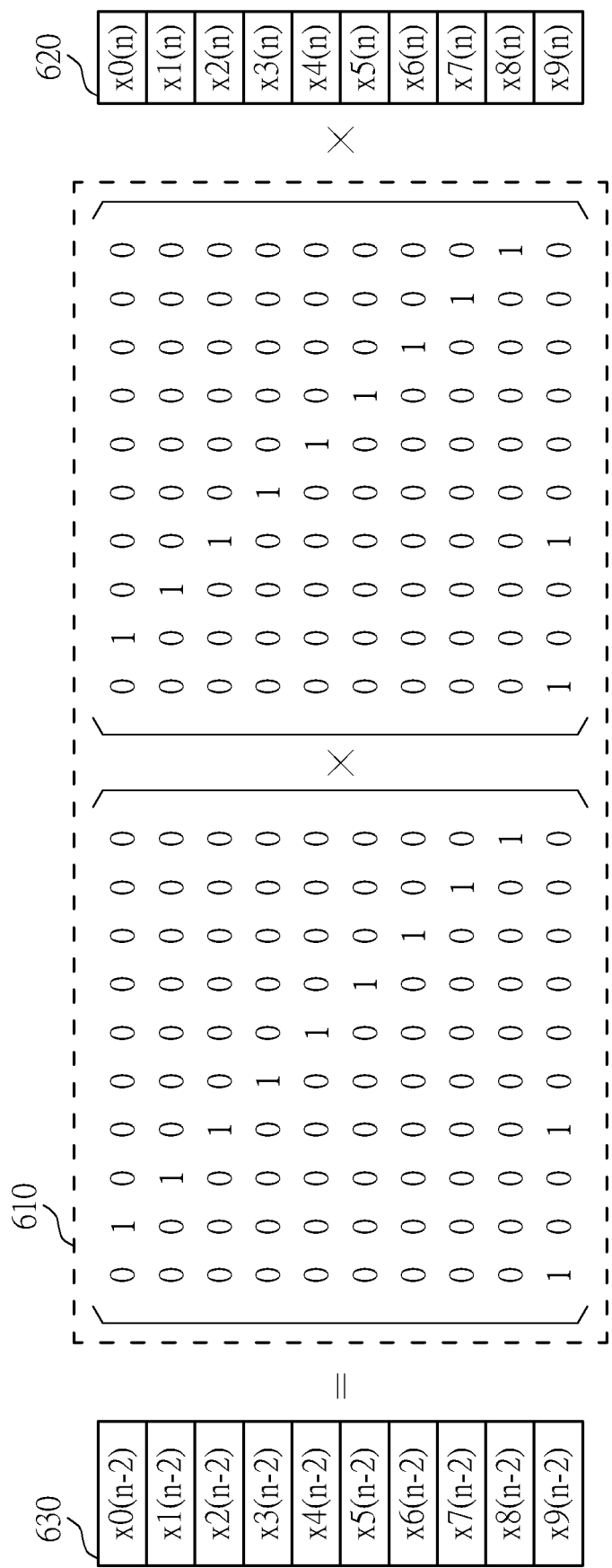
FIG. 6 is a schematic diagram showing an exemplary phase-shifted matrix according to another embodiment of the invention.

FIG. 6 is a schematic diagram showing an exemplary phase-shifted matrix according to another embodiment of the invention. In this embodiment, the phase-shifted version $x0(n-2)\sim x9(n-2)$ of the sequence $x0(n)\sim x9(n)$ by shifting 2 clock cycles in the backward direction is required. Therefore, in this embodiment, the processor 110 may directly multiply the input sequence 620 and the phase-shifted matrix 610 to obtain the output sequence 630, where the phase-shifted matrix 610 is the $2^{nd}$ power of the fundamental matrix 510 (that is, the square of the fundamental matrix 510).

Based on the concept as discussed above, the present invention may be implemented in different ways. According to a first embodiment of the invention, the memory device 120 may store a fundamental matrix derived based on the mechanism for generating a predetermined code sequence. The processor 110 may read the fundamental matrix from the memory device 120 and generate the output sequence according to the input sequence and the fundamental matrix as discussed above. For example, when a sequence which is a k clock cycle(s) phase-shifted version of an input sequence is required, the processor 110 may merely multiply the input sequence and the k-th power of the fundamental matrix together to obtain the required output sequence.

Figure 7:
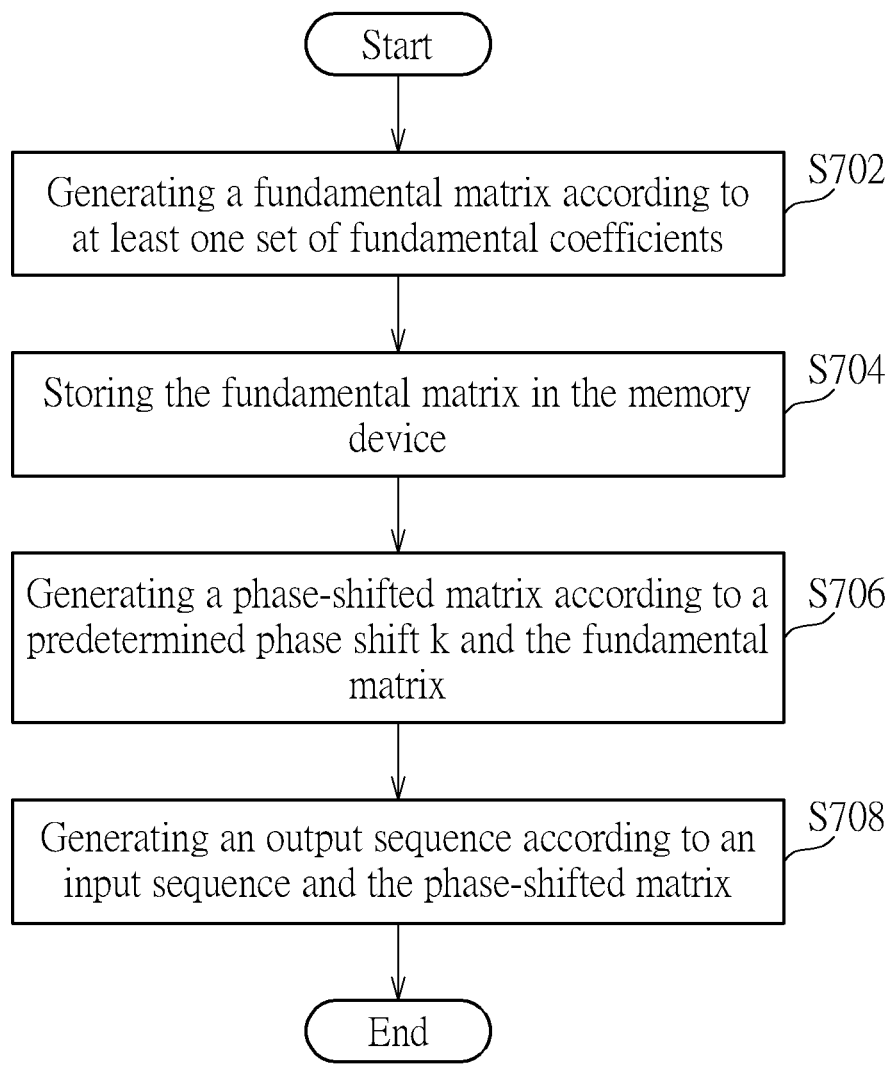
FIG. 7 is a flow chart of the proposed signal processing method according to a first embodiment of the invention.

FIG. 7 is a flow chart of the proposed signal processing method according to a first embodiment of the invention. The proposed signal processing method may be performed by the processor 110 and comprise the following steps:

Step S702: generating a fundamental matrix according to at least one set of fundamental coefficients, wherein the set of fundamental coefficients is used to generate at least one bit of a code sequence.

Step S704: storing the fundamental matrix in the memory device 120.

Step S706: generating a phase-shifted matrix according to a predetermined phase shift k and the fundamental matrix.

Step S708: generating an output sequence according to an input sequence and the phase-shifted matrix, wherein the output sequence is a phase-shifted version of the input sequence being shifted by k cycle(s).

It should be noted that if substantially the same result can be obtained, some steps can be inserted therein or one or more steps may be skipped. For example, when the fundamental matrix has already been derived, or when the fundamental matrix has already been stored in the memory device 120, step S702 may be skipped and step S704 may be adjusted as reading the fundamental matrix from the memory device 120 for the processor 110 to perform the subsequent calculation. In addition, as can be seen from the equations Eq. (2)~Eq. (10), the future value of the $2^{nd}\sim 10^{th}$ shift registers is just the current value of their previous stage of shift register. Therefore, in step S702, the fundamental matrix may be simply derived according to only one set of fundamental coefficients, and the remaining content (for example, when the fundamental matrix is a forward sequence generating matrix, the remaining content is the second to the bottom row vectors) of the fundamental matrix may be simply obtained by just filling the coefficient 0 or 1 in the corresponding positions. However, when the mechanism or the polynomial for generating a code sequence is relatively complicated, in step S702, the fundamental matrix may be generated according to more than one set of fundamental coefficients, where the more than one set of fundamental coefficients are also derived from the mechanism utilized for generating the code sequence.

According to a second embodiment of the invention, the memory device 120 may store one or more phase-shifted matrix derived from the fundamental matrix derived. The processor 110 may read the phase-shifted matrix that it needs from the memory device 120 according to the required phase shift k and generate the output sequence according to the input sequence and the corresponding phase-shifted matrix as discussed above. For example, when a sequence which is a k clock cycle(s) phase-shifted version of an input sequence is required, the processor 110 may merely multiply the input sequence and the phase-shifted matrix corresponding to the phase shift k to obtain the required output sequence.

Figure 8:
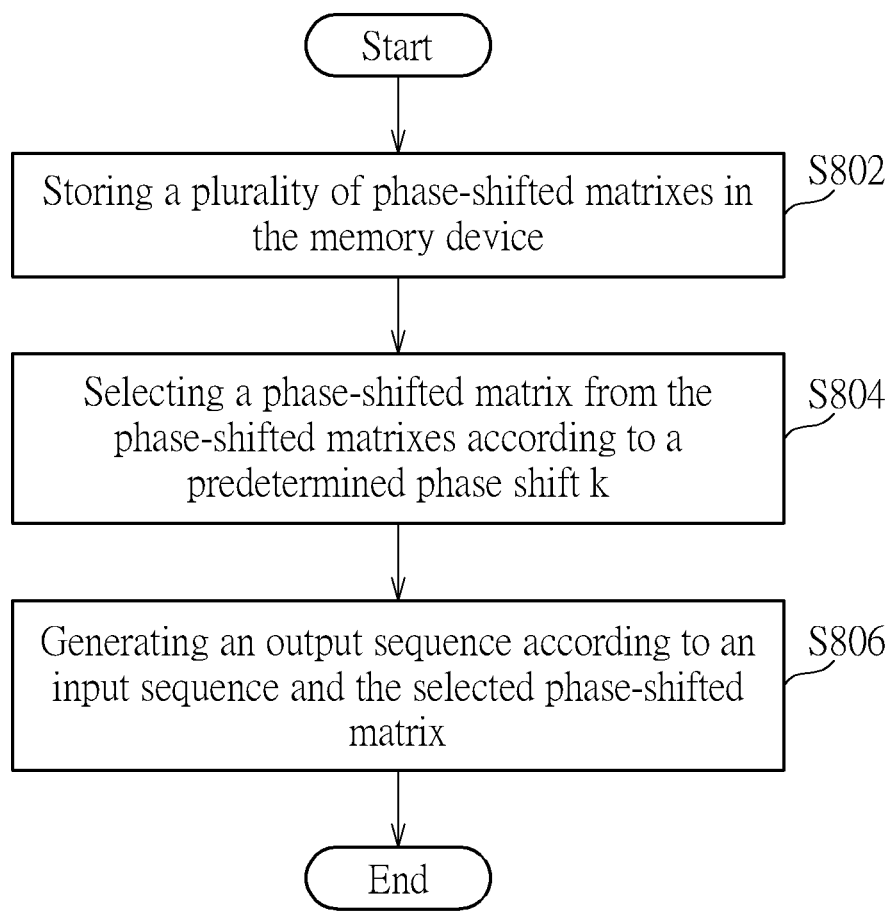
FIG. 8 is a flow chart of the proposed signal processing method according to a second embodiment of the invention.

FIG. 8 is a flow chart of the proposed signal processing method according to a second embodiment of the invention. The proposed signal processing method may be performed by the processor 110 and comprise the following steps:

Step S802: storing a plurality of phase-shifted matrixes in the memory device 120, wherein the phase-shifted matrixes are generated according to different phase shifts and a fundamental matrix as discussed above.

Step S804: selecting a phase-shifted matrix from the phase-shifted matrixes according to a predetermined phase shift k.

Step S806: generating an output sequence according to an input sequence and the selected phase-shifted matrix, wherein the output sequence is a phase-shifted version of the input sequence being shifted by k cycle(s).

It should be noted that if substantially the same result can be obtained, some steps can be inserted therein or one or more steps may be skipped. For example, when the phase-shifted matrixes have already been stored in the memory device 120, step S802 may be skipped. In addition, the selection in step S804 may comprise the operations of reading the memory device 120.

Besides the embodiments in which the output sequence is dynamically or in real time calculated according to the input sequence, or in which the phase-shifted matrix is dynamically or in real time calculated according to the fundamental matrix, in other embodiments, the sequence permutation results may also be calculation and stored in the memory device 120 in advanced and the output sequence may be directly obtained through a table lookup operation.

According to a third embodiment of the invention, the memory device 120 may also store the sequence permutation results obtained by phase shifting an input sequence by different amount of phase shift in the memory device 120 (and/or the sequence permutation results with respect to different input sequences). The processor 110 may directly read the corresponding output sequence from the memory device 120 according to the required phase shift k and the content of input sequence. For example, when a k clock cycle(s) phase-shifted version of a code sequence is required, the processor 110 merely have to lookup a predefined table according to the content of the input sequence and the corresponding phase shift k to obtain the required output sequence (that is, the k clock cycle(s) phase-shifted version of the input sequence).

Figure 9:
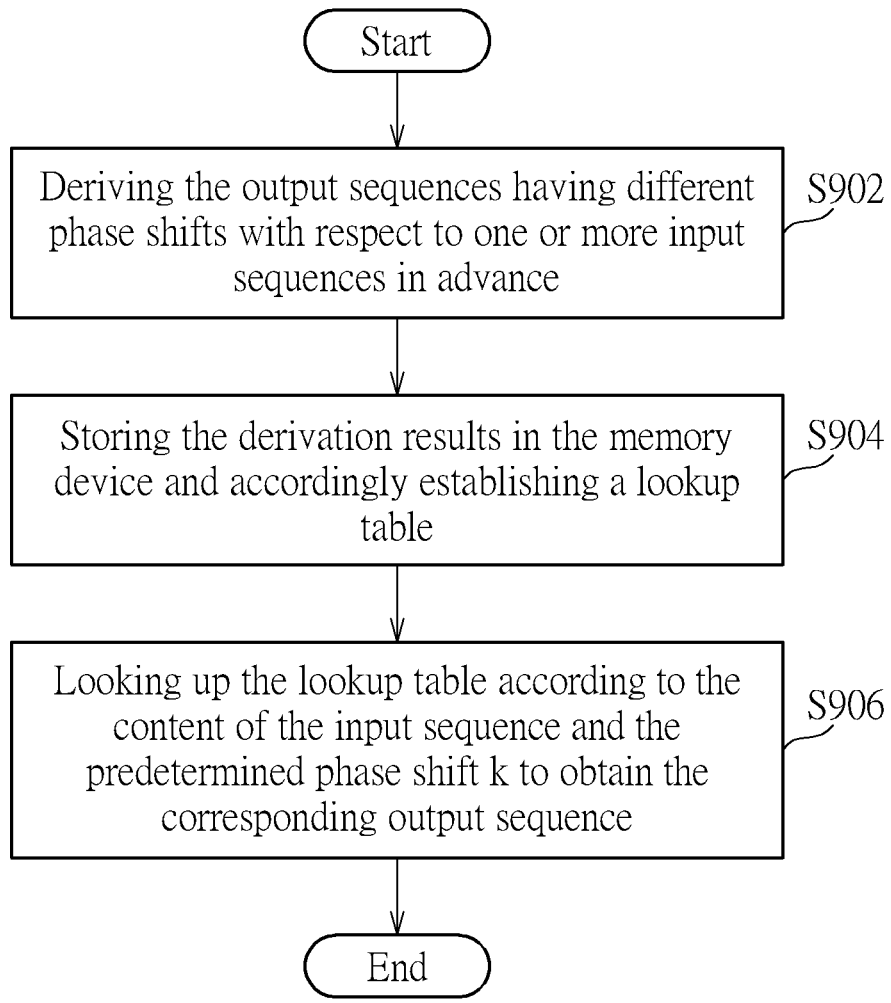
FIG. 9 is a flow chart of the proposed signal processing method according to a third embodiment of the invention.

FIG. 9 is a flow chart of the proposed signal processing method according to a third embodiment of the invention. The proposed signal processing method may be performed by the processor 110 and comprise the following steps:

Step S902: deriving the output sequences having different phase shifts with respect to one or more input sequences in advance, wherein the aforementioned matrix operations (calculations) may be applied when deriving the output sequences.

Step S904: storing the derivation results in the memory device 120 and accordingly establishing a lookup table. One independent lookup table may be established for an input sequence for recording the sequence permutation results of this input sequence corresponding to different phase shifts.

Step S906: looking up the lookup table according to the content of the input sequence and the predetermined phase shift k to obtain the corresponding output sequence. To be more specific, the processor 110 may obtain the information regarding which address the corresponding output sequence is stored in the memory device 120 by looking up the lookup table, and then access the corresponding address of the memory device 120 to obtain the required output sequence.

It should be noted that if substantially the same result can be obtained, some steps can be inserted therein or one or more steps may be skipped. For example, after performing steps S902 and S904, when the input sequence and the mechanism for generating the code sequence remain unchanged, the processor 110 may perform only step S906 in one or more subsequent operations to obtain the output sequence corresponding to different phase shifts.

As discussed above, in the embodiments of the invention, when a permuted sequence which is a k clock cycle(s) phase-shifted version of an input sequence is required, the permuted sequence can be rapidly obtained by the matrix operations or by looking up the lookup table as discussed above. In this manner, the PN code sequence permutation can be rapidly achieved based on the required phase shift k, and there is no need to wait for the LFSR circuit to operate for k clock cycles to obtain the required PN code sequence as the conventional design. Therefore, the inefficiency problem in conventional design can be solved.

Especially, when the value of k is pretty close to the period N of the cyclic sequence, for example, when k=(N−1). If only the conventional approach can be applied, it has to wait for the LFSR circuit to operate for (N−1) clock cycles to obtain the required output sequence, causing a lot of computing time waste. This is a common situation that will occur when performing time and frequency synchronization in communication systems, and it is a big problem for system designers. The reason of causing such a big problem is that when performing time and frequency synchronization, the receiver has to obtain different phase shifted results by phase shifting the seed (the initial values of the code sequence) based on different amount of phase shifts and then uses the obtained results to calculate the correlation between the received signal and the code sequence maintained at the receiver side and the correlations between the received signal and one or more phase-shifted versions of the code sequence, so as to accurately estimate the amount of time shift and the amount of frequency shift caused by the channel effect. In addition, in the conventional design in which the code sequence is generated by shifting the bits in the LFSR circuit, the code sequence cannot be generated in the backward direction (since the bits cannot be shifted in the backward direction in the LFSR circuit). Therefore, in the conventional design, it will take a lot of time to perform synchronization when the value of k is large, causing the aforementioned time consuming problem.

However, phase shifting the seed (or the input sequence) by (N−1) cycles in the forward direction is the same as phase shifting the seed by 1 cycle in the backward direction. As the backward sequence generation can be simply achieved by using the backward sequence generating matrix, when the proposed signal processing method or signal processing device is applied, the required output sequence can be directly obtained by simply multiplying the seed and the backward sequence generating matrix together. In this manner, the aforementioned time consuming problem occurred when generating the required output sequence can be efficiently solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing method, comprising:
generating, by a processor of a signal processing device, a fundamental matrix according to at least one set of fundamental coefficients, wherein the set of fundamental coefficients is used to generate at least one bit of a code sequence;
generating, by the processor, a phase-shifted matrix according to a predetermined phase shift and the fundamental matrix; and
generating, by the processor, an output sequence according to an input sequence and the phase-shifted matrix,
wherein the input sequence and the output sequence are Pseudo Noise (PN) code sequences and the output sequence is a phase-shifted version of the input sequence being shifted by k cycle(s), and wherein k is the predetermined phase shift, and
wherein the signal processing method further comprises:
performing, by a receiver, time and frequency synchronization with a transmitter by using the input sequence, the output sequence and a signal received from the transmitter.

2. The signal processing method of claim 1, wherein the set of fundamental coefficients is a row vector forming the fundamental matrix.

3. The signal processing method of claim 2, wherein the fundamental matrix is a forward sequence generating matrix and the set of fundamental coefficients is a top row vector of the fundamental matrix.

4. The signal processing method of claim 2, wherein the fundamental matrix is a backward sequence generating matrix and the set of fundamental coefficients is a bottom row vector of the fundamental matrix.

5. The signal processing method of claim 1, wherein the phase-shifted matrix is a k-th power of the fundamental matrix.

6. The signal processing method of claim 1, wherein the step of generating the output sequence according to the input sequence and the phase-shifted matrix further comprises:
multiplying the input sequence and the phase-shifted matrix together to obtain the output sequence.

7. A signal processing method, comprising:
storing, by a processor of the signal processing device, a plurality of phase-shifted matrixes in a memory device of the signal processing device, wherein the phase-shifted matrixes are generated according to different phase shifts and a fundamental matrix and the fundamental matrix is used to generate a code sequence;
selecting, by the processor, a phase-shifted matrix from the phase-shifted matrixes according to a predetermined phase shift; and
generating, by the processor, an output sequence according to an input sequence and the selected phase-shifted matrix,
wherein the input sequence and the output sequence are Pseudo Noise (PN) code sequences and the output sequence is a phase-shifted version of the input sequence being shifted by k cycle(s), and wherein k is the predetermined phase shift, and
wherein the signal processing method further comprises:
performing, by a receiver, time and frequency synchronization with a transmitter by using the input sequence, the output sequence and a signal received from the transmitter.

8. The signal processing method of claim 7, wherein the fundamental matrix is generated according to at least one set of fundamental coefficients, and the set of fundamental coefficients is used to generate at least one bit of the code sequence.

9. The signal processing method of claim 8, wherein the set of fundamental coefficients is a row vector forming the fundamental matrix.

10. The signal processing method of claim 8, wherein the fundamental matrix is a forward sequence generating matrix and the set of fundamental coefficients is a top row vector of the fundamental matrix.

11. The signal processing method of claim 8, wherein the fundamental matrix is a backward sequence generating matrix and the set of fundamental coefficients is a bottom row vector of the fundamental matrix.

12. The signal processing method of claim 7, wherein the phase-shifted matrix is a k-th power of the fundamental matrix.

13. The signal processing method of claim 7, wherein the step of generating the output sequence according to the input sequence and the selected phase-shifted matrix further comprises:
multiplying the input sequence and the selected phase-shifted matrix together to obtain the output sequence.

14. A signal processing device, comprising:
a memory device, configured to store at least one phase-shifted matrix; and
a processor, coupled to the memory device and configured to read the phase-shifted matrix from the memory device and generate an output sequence according to an input sequence and the phase-shifted matrix,
wherein the input sequence and the output sequence are Pseudo Noise (PN) code sequences, the phase-shifted matrix is generated according to a predetermined phase shift based on a fundamental matrix, the fundamental matrix is utilized to generate a code sequence and the output sequence is a phase-shifted version of the input sequence being shifted by k cycle(s), and wherein k is the predetermined phase shift, and
wherein the output sequence is provided for a receiver to perform time and frequency synchronization with a transmitter by using the input sequence, the output sequence and a signal received from the transmitter.

15. The signal processing device of claim 14, wherein the processor is further configured to generate a plurality of phase-shifted matrixes according to a plurality of different phase shifts and the fundamental matrix and store the phase-shifted matrixes in the memory device.

16. The signal processing device of claim 14, wherein the processor is further configured to generate the fundamental matrix according to at least one set of fundamental coefficients, and the set of fundamental coefficients is used to generate at least one bit of the code sequence.

17. The signal processing device of claim 16, wherein the fundamental matrix is a forward sequence generating matrix and the set of fundamental coefficients is a top row vector of the fundamental matrix.

18. The signal processing device of claim 16, wherein the fundamental matrix is a backward sequence generating matrix and the set of fundamental coefficients is a bottom row vector of the fundamental matrix.

19. The signal processing device of claim 14, wherein the phase-shifted matrix is a k-th power of the fundamental matrix.

20. The signal processing device of claim 14, wherein the processor is further configured to multiply the input sequence and the phase-shifted matrix together to obtain the output sequence.

* * * * *